United States Patent
Sun et al.

(10) Patent No.: US 6,482,682 B2
(45) Date of Patent: Nov. 19, 2002

(54) MANUFACTURING METHOD FOR IMPROVING RELIABILITY OF POLYSILICON THIN FILM TRANSISTORS

(75) Inventors: Jeng-Hung Sun, Tainan; Wen-Tung Wang, Hsinchu, both of (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/792,215

(22) Filed: Feb. 20, 2001

(65) Prior Publication Data

US 2002/0115272 A1 Aug. 22, 2002

(51) Int. Cl.[7] .............................................. H01L 21/76
(52) U.S. Cl. ....................................................... 438/149
(58) Field of Search ................................. 438/149, 151, 438/486, 487, 770, 771, 773, 756, 976

(56) References Cited

U.S. PATENT DOCUMENTS 5,395,804 A * 3/1995 Ueda
5,926,701 A * 7/1999 Li

* cited by examiner

Primary Examiner—Keith Christianson
(74) Attorney, Agent, or Firm—W. Wayne Liauh

(57) ABSTRACT

The invention discloses a manufacturing method for improving the reliability of polysilicon thin film transistors to solve electric leaking problem due to the roughness of polysilicon layer surface. In the thin film transistor manufacturing process, a polysilicon layer surface is oxidized to produce a silicon oxide layer which is then removed by an etching solution. This method can planarize bumps on the polysilicon layer generated due to re-crystallization so as to effectively lower the roughness of the polysilicon surface, thus increasing the reliability of thin film transistors.

11 Claims, 4 Drawing Sheets

MANUFACTURING METHOD FOR IMPROVING RELIABILITY OF POLYSILICON THIN FILM TRANSISTORS

BACKGROUND OF THE INVENTION

1. Field of Invention

The present invention relates to a manufacturing method of polysilicon thin film transistors and, more particularly, to a manufacturing method for improving the reliability of polysilicon thin film transistors.

2. Related Art

The invention of transistors have produced revolutionary influence on the electronic industry and greatly changed human life. Thin film transistors are a type of very important semiconductor elements. According to the manufacturing processes, the thin film transistors can be classified into amorphous silicon thin film transistors and polysilicon thin film transistors. Since the defects in the amorphous thin film transistors will affect the electron mean free path, the electron mobility speed is slower, whereas that of the polysilicon transistor is about 100 times faster. Therefore, polysilicon thin film transistors have slowly become the trend of thin film transistors and have been widely used in the driving circuits for liquid crystal displays (LCDs). FIGS. 1A and 1B show a schematic cross-sectional structure of a metal oxide semiconductor (MOS) thin film transistor. A polysilicon layer 2 is formed on a glass substrate 1. The polysilicon layer 2 has two heavily doped n$^-$ regions 3, 4, corresponding to a source 5 and a drain 6, respectively. An insulation layer 7 is formed on the glass substrate 1 and the polysilicon layer 2 with only the two heavily doped n regions 3, 4 exposed as the contact windows to the source 5 and the drain 6. A gate 8 is formed on the polysilicon layer 2 between the two n$^-$ regions 3, 4. Between the gate 8 and the polysilicon layer 2 is sandwiched with gate oxide 9. In the manufacturing process, the polysilicon layer 2 is a polycrystalline structure formed by re-crystallization from an amorphous silicon layer. Therefore, bumps 11 will form at the grain boundary 10 and thus increase the roughness on the polysilicon layer 2. As the operation voltage at the bate of the polysilicon thin film transistor is fairly high and the gate oxide 9 is relatively thin, it is very likely to have electricity leaking at the bumps 11 if the polysilicon layer 2 is too rough, resulting in ineffectiveness of the thin film transistor and lowered reliability of polysilicon thin film transistors.

In view of the foregoing, it is highly desirable to provide a manufacturing method for improving the reliability of polysilicon thin film transistors that can avoid the above problems.

SUMMARY OF THE INVENTION

It is an object of the invention to solve the electricity leaking problem due to very rough polysilicon layer surface in polysilicon thin film transistors by providing a new manufacturing method to improve the reliability of polysilicon thin film transistors.

Pursuant to the above object, the disclosed method oxidizes a polysilicon layer deposited on a substrate to produce a silicon oxide layer in the polysilicon thin film transistor manufacturing process. An etching solution is further employed to remove the silicon oxide layer so as to planarize bumps produced in the re-crystallization on the polysilicon layer surface, thus effectively decreasing the roughness of the polysilicon layer surface.

The disclosed manufacturing method for improving the reliability of polysilicon thin film transistors at least includes the following steps of: providing a substrate; forming a polysilicon layer on the substrate; oxidizing the polysilicon layer surface to produce a silicon oxide layer; etching away the silicon oxide layer in order to planarize the polysilicon layer surface; and completing a thin film transistor on the planarized polysilicon layer which is taken as the active layer of the thin film transistor.

In the above method, the step of oxidizing the polysilicon layer surface can be performed by generating ozone from ozone water or using excimer UV light. Furthermore, one can also radiate the polysilicon layer surface in an $O_2$ atmosphere using a lamp to provide oxidation free energy for speeding up the polysilicon layer surface oxidation. Such methods include the rapid thermal annealing (RTA) and low energy excimer laser. The step of etching away the silicon oxide layer can be done by using a proper etching solution such as the DHF, BOE solutions.

After the polysilicon layer surface planarization by oxidation and etching, taking the resulting polysilicon layer as an active layer for the thin film transistor can form a highly reliable polysilicon thin film transistor by employing conventional photolithography, etching and doping, vapor phase deposition (VPD), etc.

BRIEF DESCRIPTION OF THE DRAWINGS

The present invention will become more fully understood from the detailed description given hereinbelow illustration only, and thus are not limitative of the present invention, and wherein:

FIGS. 2A through 2F depict cross-sectional views showing the procedure of an embodiment manufacturing method for improving the reliability of polysilicon thin film transistors; wherein FIGS. 2A and 2B show that a glass substrate is deposited with buffer oxide, which is then covered by a polysilicon layer;

FIG. 2C shows that a silicon oxide layer is formed on the polysilicon layer surface;

FIG. 2D shows that a planarized polysilicon layer surface after etching away the silicon oxide;

FIG. 2E shows two heavily doped regions implanted into the polysilicon layer; and FIG. 2F shows that an insulation layer, a source, a drain and a gate are formed on the polysilicon layer.

DETAILED DESCRIPTION OF THE INVENTION

The manufacturing method for improving the reliability of polysilicon thin film transistors disclosed herein will be described with reference to FIGS. 2A through 2F using an embodiment of a metal oxide semiconductor (MOS) thin film transistor.

Figures 1A, 1B:
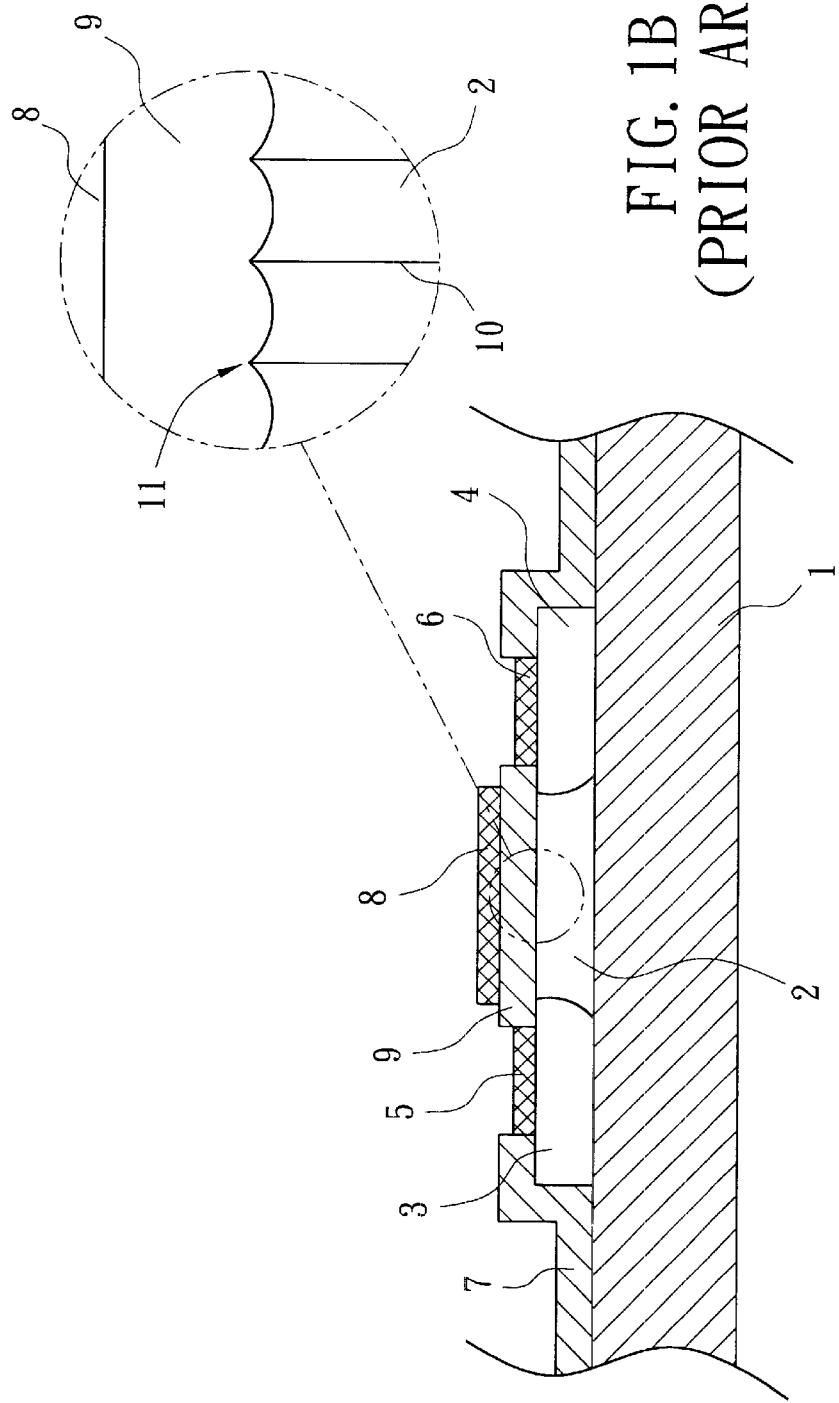
FIGS. 1A and 1B show structural cross-sectional views of a conventional thin film transistor.
Figure 2B:
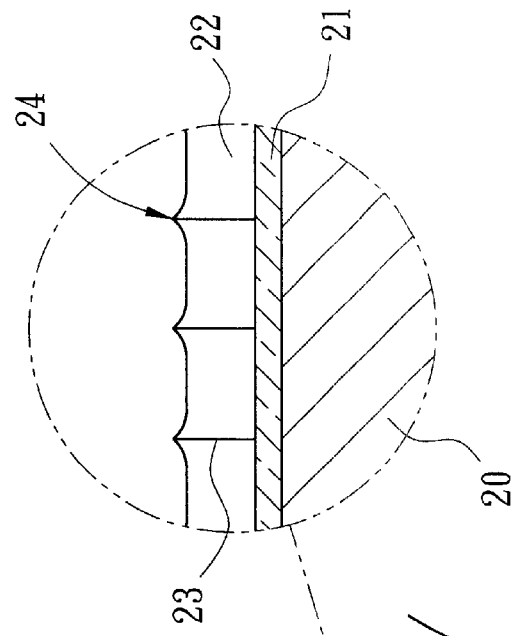
Figure 2A:
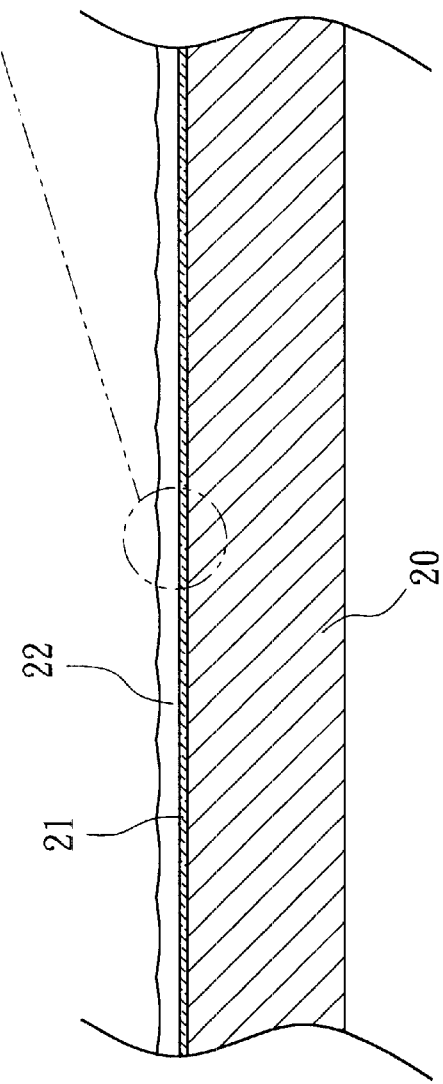
Figure 2C:
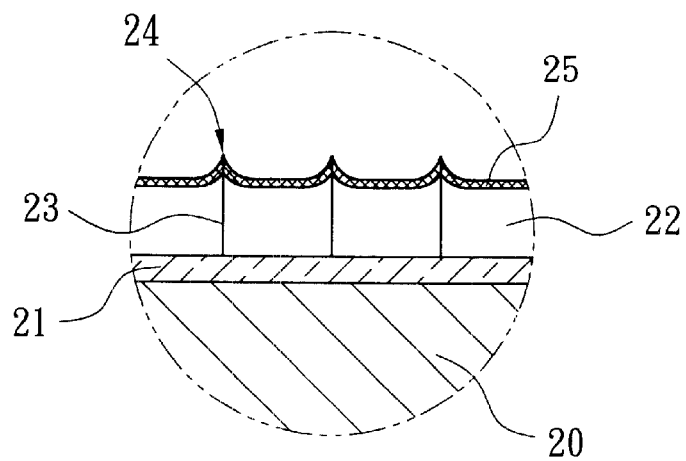

As shown in FIGS. 2A and 2B, a substrate 20 such as a glass substrate is provided. A buffer oxide 21 can be formed on the substrate 20 to protect the substrate 20. A polysilicon layer 22 is then formed on the buffer oxide 21. The method to form the polysilicon layer 22 can be, for example, first depositing an amorphous silicon layer on the buffer oxide 21 in the vapor phase deposition (VPD) method and then produce re-crystallization on the amorphous silicon layer by excimer laser annealing (ELA) to form a polysilicon layer. When the amorphous silicon forms polysilicon due to re-crystallization, bumps 24 will form at the grain boundary 23, resulting in a rough surface of the polysilicon layer 22. As the grains of the polysilicon grow bigger and bigger, the bumps 24 at the grain boundary 23 will protrude more from the surfaced; that is, the surface becomes rougher. The net effect of the rough surface is that the thin film transistor may become ineffective, which is not what we want.

Figure 2D:
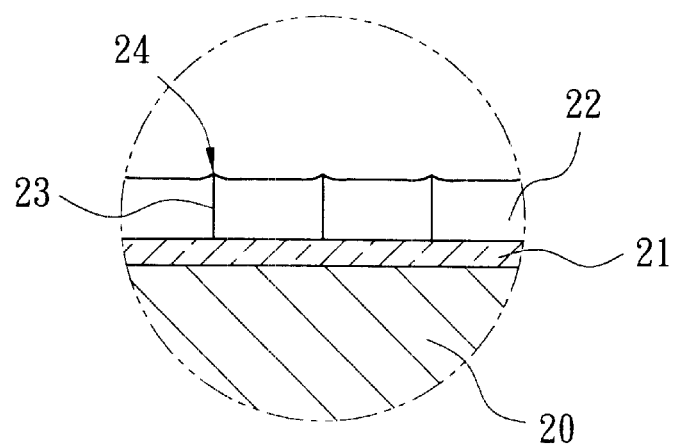

As shown in FIG. 2D, the polysilicon layer surface 22 is oxidized to form silicon oxide ($SiO_x$) layer 25 thereon. There are many methods one can choose to form the silicon oxide layer 25. For example, one can use ozone water to oxidize the polysilicon layer surface 22 or, alternatively, use excimer UV light to generate ozone to oxidize the polysilicon layer surface 22. Besides, one can also use rapid thermal annealing (RTA) or low energy excimer laser to radiate the polysilicon layer surface 22 using laser in an $O_2$ atmosphere. This method can provide the oxidation free energy for the polysilicon layer surface 22 to speed up the oxidation process.

Afterwards, a proper etching solution such as the DHF, BOE solution (an etching solution from an admixture of corrosive solutions such as nitric acid and DHF) or other similar etching solution is used to etch away the silicon oxide layer 25. This can effectively planarize the bumps 24 on the polysilicon grain boundary, decreasing the roughness of the polysilicon layer surface 22.

Figure 2E:
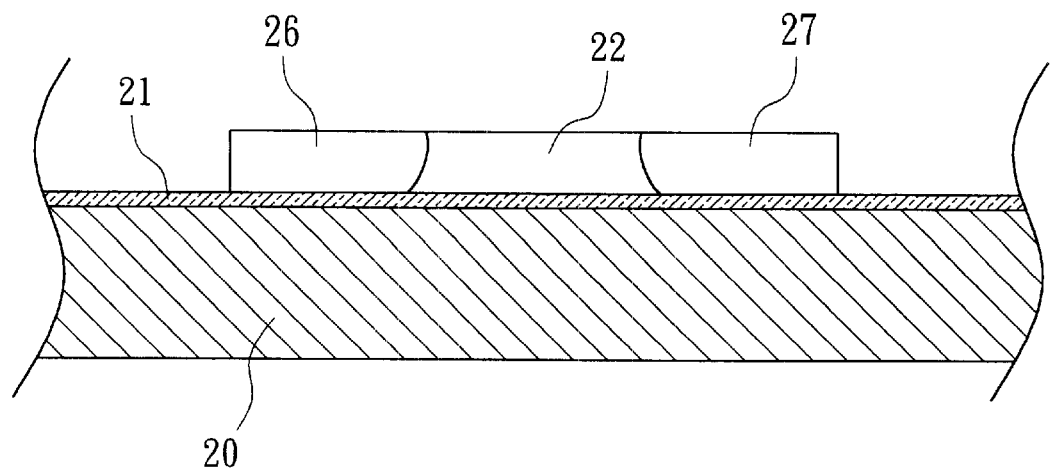

As shown in FIG. 2E, the conventional lithography and etching processes can be employed to pattern the polysilicon layer 22, thus defining the area of the active layer for the thin film transistor. The active layer is the part in the polysilicon layer 22 that constitutes the thin film transistor. The polysilicon layer 22 is then implanted with two appropriately heavily doped areas, such as the two $n^-$ regions 26, 27.

Figure 2F:
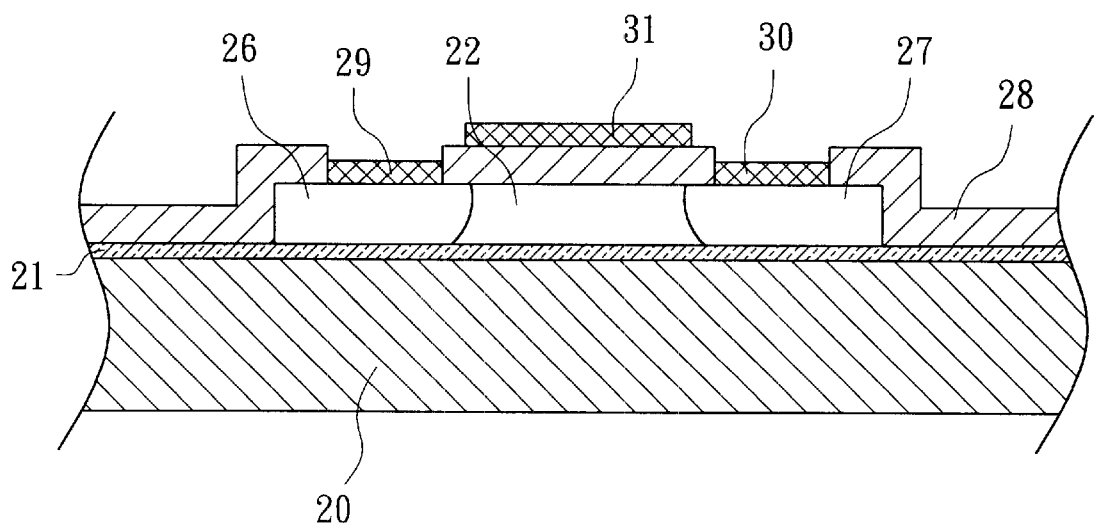

With reference to FIG. 2F, the polysilicon layer 22 is formed with an insulation layer 28 by, for example, plasma enhanced chemical vapor deposition (CVD). The insulation layer 28 has contact windows formed at the region corresponding to the two n regions 26,27. The insulation layer 28 can be made of SiN or other proper insulation materials. A source 29 and a drain 30 are then formed at the two $n^-$ regions 26, 27. A gate 31 is then formed on the polysilicon layer 22 between the two $n^-$ regions 26, 27. In particular, the gate is separated from the polysilicon layer 22 by the insulation layer 28. The insulation layer 28 between the gate 31 and the polysilicon layer 22 is gate oxide.

Through the disclosed manufacturing method, the polysilicon thin film transistor produced can have a planarized grain boundary with bumps smoothed. The roughness of the polysilicon layer surface can be reduced. This can reduce the possibility of transistor ineffectiveness due to electricity leakage at the gate insulation layer under a high gate operation voltage and a thin gate insulation layer. Therefore, the method can effectively increase the reliability of polysilicon thin film transistors.

Although the invention has been described with reference to specific embodiments, this description is not meant to be construed in a limiting sense. Various modifications of the disclosed embodiments, as well as alternative embodiments, will be apparent to persons skilled in the art. For example, the steps of oxidizing the polysilicon layer surface and etching away the silicon oxide on the polysilicon layer surface can be properly modified or adjusted before the step of forming the insulation layer. In addition, the steps of forming the insulation layer and the source, drain and gate are not restricted by the embodiment and can be modified according to different structures of the polysilicon thin film transistors. It is, therefore, contemplated that the appended claims will cover all modifications that fall within the true scope of the invention.

What is claimed is:

1. A manufacturing method for improving the reliability of polysilicon thin film transistors, which comprises the steps of:

providing a substrate;

forming a buffer oxide layer on the substrate followed by forming a polysilicon layer on the substrate;

oxidizing the polysilicon layer surface to produce a silicon oxide layer;

etching away the silicon oxide; and taking the polysilicon layer as the active layer of thin film transistors to complete the thin film transistor manufacturing;

wherein the step of taking the polysilicon layer as the active layer of thin film transistors to complete the thin film transistor manufacturing comprises the steps of:

providing a pattern on the polysilicon layer to define the area of the active layer;

forming two appropriate heavily doped regions on the polysilicon layer;

forming an insulation layer on the polysilicon layer with two contact windows formed at the places corresponding to the two heavily doped regions; and forming a proper gate on the insulation layer and a source and drain at the two contact windows, respectively;

further wherein the insulation layer is silicon nitride, and the substrate is a glass substrate.

2. The manufacturing method of claim 1, wherein the thin film transistor is a metal oxide semiconductor (MOS) thin film transistor.

3. The manufacturing method of claim 1, wherein the heavily doped region is an n region.

4. The manufacturing method of claim 1, wherein the step of forming the polysilicon layer comprises the steps of:

forming an amorphous silicon layer on the substrate; and using excimer laser annealing to produce re-crystallization on the amorphous silicon layer that turns the amorphous silicon layer into a polysilicon layer.

5. The manufacturing method of claim 1, wherein the step of oxidizing the polysilicon layer surface is performed using ozone water.

6. The manufacturing method of claim 1, wherein the step of oxidizing the polysilicon layer is done by using a lamp to radiate the polysilicon layer surface in an $O_2$ atmosphere to speed up oxidation of the polysilicon layer surface.

7. The manufacturing method of claim 6, wherein the method of using lamp radiation to speed up the polysilicon layer surface oxidation is rapid thermal annealing (RTA).

8. The manufacturing method of claim 6, wherein the method of using lamp radiation to speed up the polysilicon layer surface oxidation is to use low energy excimer laser.

9. The manufacturing method of claim 1, wherein the step of oxidizing the polysilicon layer surface is achieved by using excimer UV light to generate ozone to perform the polysilicon layer surface oxidation.

10. The manufacturing method of claim 1, wherein the step of etching away the silicon oxide layer uses the DHF solution.

11. The manufacturing method of claim 1, wherein the step of etching away the silicon oxide layer uses the BOE solution.

* * * * *